(12) United States Patent
Kohda

(10) Patent No.: US 8,198,639 B2
(45) Date of Patent: Jun. 12, 2012

(54) METHOD OF MANUFACTURING LIGHT EMITTING DEVICE WITH A PAIR OF RIDGE PROTECTION ELECTRODES

(75) Inventor: Shinichi Kohda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 267 days.

(21) Appl. No.: 12/230,619

(22) Filed: Sep. 2, 2008

(65) Prior Publication Data

US 2009/0101927 A1   Apr. 23, 2009

(30) Foreign Application Priority Data

Sep. 3, 2007   (JP) ................................. 2007-228032

(51) Int. Cl.
*H01L 33/36* (2010.01)
(52) U.S. Cl. ............... 257/81; 257/13; 257/79; 257/94; 257/99; 438/22
(58) Field of Classification Search ...................... 257/81
See application file for complete search history.

(56) References Cited

U.S. PATENT DOCUMENTS

| | | | | |
|---|---|---|---|---|
| 6,278,173 | B1 * | 8/2001 | Kobayashi et al. ........... | 257/627 |
| 7,358,156 | B2 * | 4/2008 | Tanaka et al. ................. | 438/462 |
| 2002/0076904 | A1 * | 6/2002 | Imler ............................ | 438/462 |
| 2003/0113977 | A1 * | 6/2003 | Choi .............................. | 438/400 |
| 2004/0191942 | A1 * | 9/2004 | Kawakami et al. ............. | 438/33 |
| 2004/0217362 | A1 * | 11/2004 | Slater et al. ...................... | 257/79 |
| 2005/0121688 | A1 * | 6/2005 | Nagai et al. ...................... | 257/99 |
| 2006/0163699 | A1 * | 7/2006 | Kumakawa et al. ........... | 257/620 |
| 2006/0209395 | A1 * | 9/2006 | Sasaoka ......................... | 359/344 |
| 2007/0063215 | A1 * | 3/2007 | Kohda .......................... | 257/103 |
| 2007/0108456 | A1 * | 5/2007 | Wong et al. ..................... | 257/94 |
| 2007/0181901 | A1 * | 8/2007 | Loh ................................ | 257/99 |
| 2007/0281484 | A1 * | 12/2007 | Ishibashi et al. .............. | 438/692 |

FOREIGN PATENT DOCUMENTS

| | | | |
|---|---|---|---|
| JP | 6283758 | | 10/1994 |
| JP | 2001-176823 | * | 6/2001 |
| JP | 2005-116844 | * | 4/2005 |

* cited by examiner

*Primary Examiner* — N Drew Richards
*Assistant Examiner* — Peter Bradford
(74) *Attorney, Agent, or Firm* — Rabin & Berdo, P.C.

(57) ABSTRACT

A method of manufacturing a semiconductor light emitting device employs a substrate formed by successively stacking an n-type semiconductor layered portion including an AlGaN layer, a light emitting layer containing In and a p-type semiconductor layered portion on a group III nitride semiconductor substrate having a larger lattice constant than AlGaN. This method includes the steps of selectively etching the substrate from the side of the p-type semiconductor layered portion along a cutting line to expose the AlGaN layer along the cutting line, forming a division guide groove along the cutting line on the exposed AlGaN layer, and dividing the substrate along the division guide groove.

20 Claims, 6 Drawing Sheets

METHOD OF MANUFACTURING LIGHT EMITTING DEVICE WITH A PAIR OF RIDGE PROTECTION ELECTRODES

BACKGROUND OF THE INVENTION

1. Field of the Invention

The present invention relates to a method for manufacturing a semiconductor light emitting device having a structure obtained by forming an n-type semiconductor layered portion, a light emitting layer and a p-type semiconductor layered portion (each made of a group III nitride semiconductor, for example) on a group III nitride semiconductor substrate. Group III nitride semiconductors are group III-V semiconductors employing nitrogen as a group V element, and typical examples thereof include aluminum nitride (AlN), gallium nitride (GaN) and indium nitride (InN), which can be generally expressed as $Al_xIn_yGa_{1-x-y}N$ ($0 \leq x \leq 1$, $0 \leq y \leq 1$ and $0 \leq x+y \leq 1$).

2. Description of Related Art

A semiconductor light emitting device having a structure obtained by growing a group III nitride semiconductor layer on a GaN substrate is known in general. Typical examples thereof include a blue light emitting diode and a blue semiconductor laser. In the case of the semiconductor laser, the group III nitride semiconductor layer has a multilayer structure obtained by successively stacking an n-type AlGaN cladding layer, an n-type GaN guide layer, an active layer (light emitting layer), a p-type GaN guide layer, a p-type GaN electron blocking layer, a p-type AlGaN cladding layer and a p-type GaN contact layer from the side of the GaN substrate, for example. The active layer has a multiple quantum well structure obtained by alternately repetitively stacking quantum well layers consisting of InGaN layers and barrier layers consisting of non-doped GaN layers, for example. According to this structure, electrons and positive holes are recombined in the active layer to emit light. The emission wavelength can be adjusted through the In composition in the quantum well layers.

SUMMARY OF THE INVENTION

A group III nitride semiconductor substrate made of GaN or the like is inferior in cleavability as compared with a substrate made of GaAs or the like generally applied to a light emitting diode or a laser diode. If division guide grooves such as scribing lines are formed in a step of dividing the semiconductor substrate into individual chips, dividing positions deviate from the division guide grooves in a subsequent breaking step, and the chip shapes become unstable. Therefore, the yield is disadvantageously reduced.

An object of the present invention is to provide a method of manufacturing a semiconductor light emitting device capable of improving the yield by stabilizing a chip shape.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
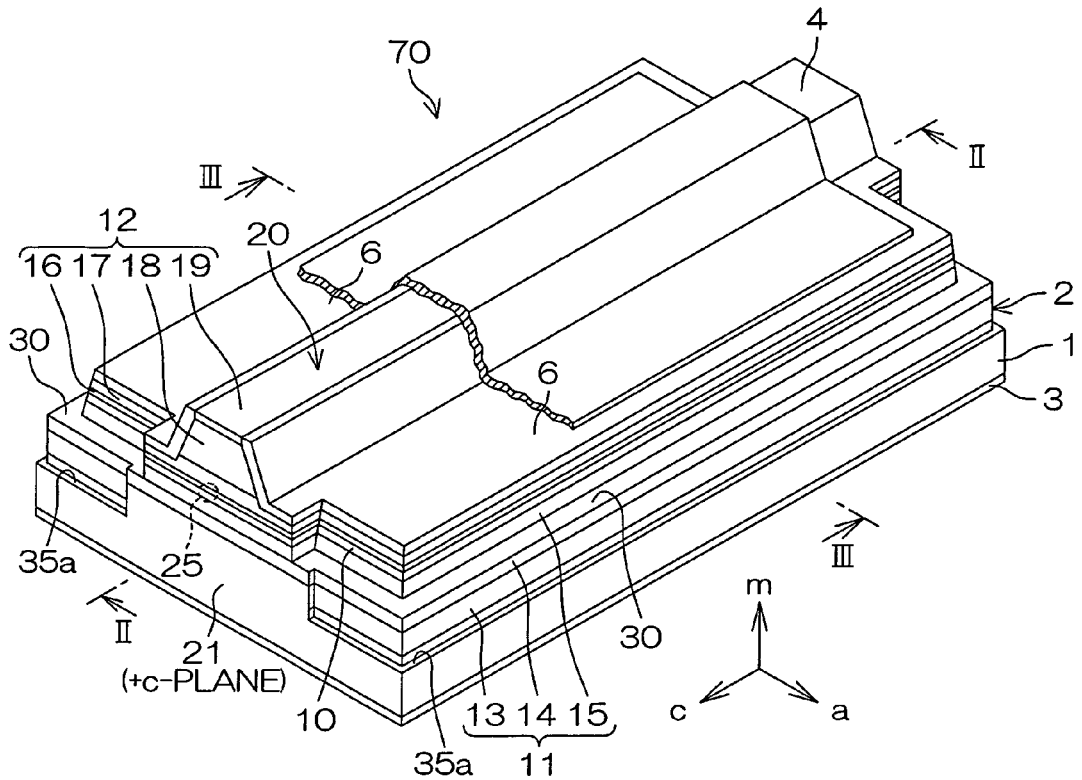
FIG. 1 is a perspective view for illustrating the structure of a semiconductor laser diode manufactured according to a method of manufacturing a semiconductor light emitting device.

A method of manufacturing a semiconductor light emitting device according to an embodiment of the present invention includes the steps of: selectively etching a substrate (wafer) formed by successively stacking an n-type semiconductor layered portion including an AlGaN layer, a light emitting layer containing In and a p-type semiconductor layered portion on a group III nitride semiconductor substrate having a larger lattice constant than AlGaN, the selective etching performed from the side of the p-type semiconductor layered portion along a cutting line to expose the AlGaN layer along the cutting line; forming a division guide groove along the cutting line on the exposed AlGaN layer; and dividing the substrate along the division guide groove.

According to this method, the semiconductor multilayer structure portion (group III nitride semiconductor multilayer structure portion, for example) formed on the group III nitride semiconductor substrate is etched along the cutting line up to the AlGaN layer included in the n-type semiconductor layered portion. The division guide groove along the cutting line is formed on the AlGaN layer exposed by this etching, and the substrate is divided along the division guide groove.

The AlGaN layer having a smaller lattice constant than the group III nitride semiconductor substrate (GaN substrate, for example) causes stress in a shrinkage direction along a major surface of the group III nitride semiconductor substrate. When the AlGaN layer is exposed by etching and the division guide groove is formed on the exposed AlGaN layer, therefore, the substrate can be spontaneously divided from the division guide groove by effectively utilizing the stress of the AlGaN layer. In particular, the light emitting layer containing In has a large lattice constant, and hence the light emitting layer located on the cutting line is so previously removed that the stress caused in the AlGaN layer can be effectively utilized for dividing the substrate and the substrate can be reliably divided along the cutting line. Therefore, the shape of each chip obtained by dividing the substrate is stabilized, and the semiconductor light emitting device can be prepared with an excellent yield.

Preferably, the substrate includes no layer containing In in between the group III nitride semiconductor substrate and the AlGaN layer. As hereinabove described, a layer containing In has a large lattice constant. When no layer containing In is provided between the AlGaN layer exposed by etching and the group III nitride semiconductor substrate, therefore, the stress of the AlGaN layer can be effectively utilized. Thus, the substrate can be more excellently divided, and the chip shape can be further stabilized.

Preferably, the step of forming the division guide groove includes a laser processing step of forming the division guide groove by laser processing. According to this method, the division guide groove can be formed by making the AlGaN layer absorb a laser beam. The division guide groove having a desired depth can be reliably formed on the hard AlGaN layer by applying the laser processing.

Preferably, the laser processing step includes a step of forming the division guide groove with a laser beam having a wavelength of 500 nm to 700 nm. According to this method, the division guide groove can be formed on the AlGaN layer by the laser processing utilizing multiphoton absorption. More specifically, the division guide groove can be formed by conversing the laser beam on the cutting line and scanning the focal point along the cutting line.

The laser beam in the wave range of 500 nm to 700 nm is absorbed by the group III nitride semiconductor only on the focal point. On the focal point, multiphoton absorption is caused due to high energy density. In other words, a next photon is incident before the group III nitride semiconductor material excited to a virtual level between a base level and an excited level by incidence of a photon returns to the base level through a certain time constant. Therefore, the group III nitride semiconductor material is excited to the excited level (two-photon absorption). Thus, the division guide groove can be reliably formed along the cutting line due to the multiphoton absorption.

The step of forming the division guide groove may include a step of forming the division guide groove with a diamond cutter. In this case, the division guide groove is formed by a scribing line with the diamond cutter, whereby process for forming the division guide groove can be performed with an apparatus having a simple structure.

The step of forming the division guide groove may include a step of forming the division guide groove with a dicer. In this case, the division guide groove is formed by dicing generally employed for dividing a semiconductor wafer.

Preferably, the AlGaN layer has a superlattice structure obtained by alternately stacking a layer made of AlGaN and a layer made of GaN. Also in the case of the AlGaN layer having such a superlattice structure, the substrate can be spontaneously divided through the stress thereof.

Group III nitride semiconductor substrates having larger lattice constants than AlGaN include an InGaN substrate, for example, in addition to the GaN substrate.

Figure 2:
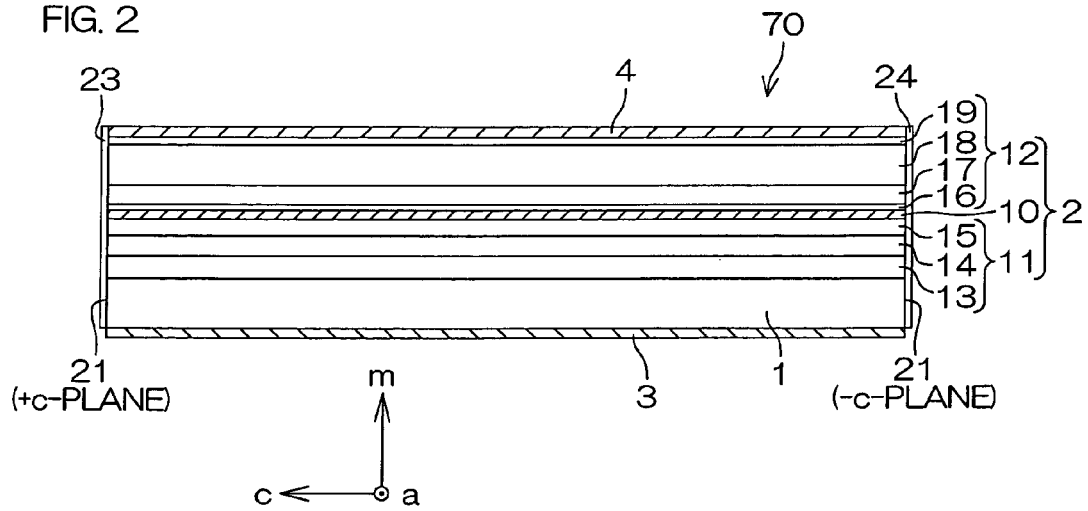
FIG. 2 is a longitudinal sectional view taken along a line II-II in FIG. 1.
Figure 3A:
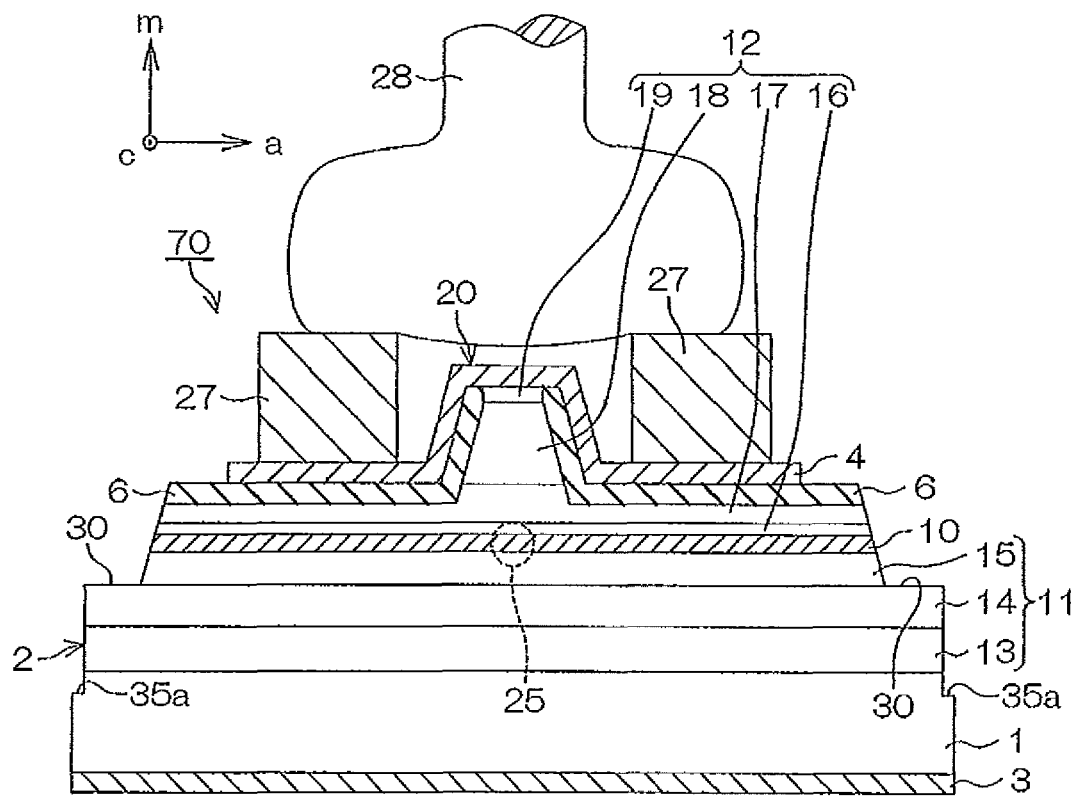
FIG. 3A is a cross sectional view taken along a line III-III in FIG. 1.
Figure 3B:
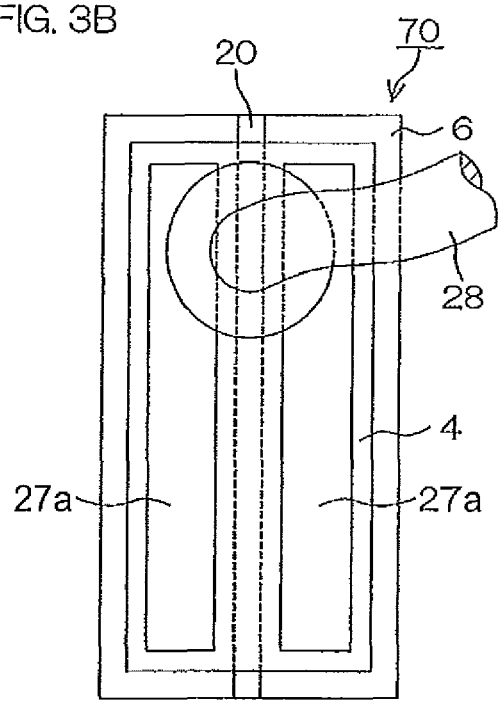
FIG. 3B is a schematic plan view of the semiconductor laser diode.

FIG. 1 is a perspective view for illustrating the structure of a semiconductor laser diode manufactured by the method of manufacturing a semiconductor light emitting device according to an embodiment of the present invention, FIG. 2 is a longitudinal sectional view taken along a line II-II in FIG. 1, FIG. 3A is a cross sectional view taken along a line III-III in FIG. 1, and FIG. 3B is a plan view of the semiconductor laser diode. Referring to FIGS. 1, 2, 3A and 3B, arrows c, m and a denote the c-axis direction, the m-axis direction and the a-axis direction respectively.

This semiconductor laser diode 70 is a Fabry-Perot laser diode including a group III nitride semiconductor substrate 1, a group III nitride semiconductor multilayer structure 2 (group III nitride semiconductor layer) formed on the group III nitride semiconductor substrate 1 by crystal growth, an n-side electrode 3 so formed as to be in contact with the back surface of the group III nitride semiconductor substrate 1 (surface opposite to the group III nitride semiconductor multilayer structure 2) and a p-side electrode 4 so formed as to be in contact with the surface of the group III nitride semiconductor multilayer structure 2.

According to this embodiment, the group III nitride semiconductor substrate 1 is constituted of a GaN monocrystalline substrate. The group III nitride semiconductor substrate 1 has a major surface defined by a nonpolar plane (m-plane in this embodiment), for example. The nonpolar plane is the a-plane or the m-plane. The group III nitride semiconductor multilayer structure 2 is formed by crystal growth on this major surface. Therefore, the group III nitride semiconductor multilayer structure 2 consists of group III nitride semiconductors having crystal growth planes defined by nonpolar planes. When the group III nitride semiconductors are epitaxially grown on the GaN monocrystalline substrate having the major surface defined by the nonpolar plane (particularly the m-plane), excellent group III nitride semiconductor crystals hardly having dislocations can be grown.

The group III nitride semiconductor multilayer structure 2 includes a light emitting layer 10, an n-type semiconductor layered portion 11 and a p-type semiconductor layered portion 12. The n-type semiconductor layered portion 11 is disposed on a side of the light emitting layer 10 closer to the group III nitride semiconductor substrate 1, while the p-type semiconductor layered portion 12 is disposed on a side of the light emitting layer 10 closer to the p-side electrode 4. Thus, the light emitting layer 10 is held between the n-type semiconductor layered portion 11 and the p-type semiconductor layered portion 12, whereby a double hetero junction structure is provided. Electrons are injected into the light emitting layer 10 from the n-type semiconductor layered portion 11, while positive holes are injected thereinto from the p-type semiconductor layered portion 12. The electrons and the positive holes are recombined in the light emitting layer 10, to emit light.

The n-type semiconductor layered portion 11 is formed by successively stacking an n-type GaN contact layer 13 (having a thickness of 2 µm, for example), an n-type AlGaN cladding layer 14 (having a thickness of not more than 1.5 µm such as a thickness of 1.0 µm, for example) and an n-type GaN guide layer 15 (having a thickness of 0.1 µm, for example) from the side closer to the group III nitride semiconductor substrate 1. On the other hand, the p-type semiconductor layered portion 12 is formed by successively stacking a p-type AlGaN electron blocking layer 16 (having a thickness of 20 nm, for example), a p-type GaN guide layer 17 (having a thickness of 0.1 µm, for example), a p-type AlGaN cladding layer 18 (having a thickness of not more than 1.5 µm such as a thickness of 0.4 µm, for example) and a p-type GaN contact layer 19 (having a thickness of 0.3 µm, for example) on the light emitting layer 10.

The n-type GaN contact layer 13 is a low-resistance layer. The p-type GaN contact layer 19 is a low-resistance layer for attaining ohmic contact with the p-side electrode 4. The n-type GaN contact layer 13 is made of an n-type semiconductor prepared by doping GaN with Si, for example, serving as an n-type dopant in a high doping concentration ($3\times10^{18}$ $cm^{-3}$, for example). The p-type GaN contact layer 19 is made of a p-type semiconductor prepared by doping GaN with Mg serving as a p-type dopant in a high doping concentration ($3\times10^{19}$ $cm^{-3}$, for example).

The n-type AlGaN cladding layer 14 and the p-type AlGaN cladding layer 18 provide a light confining effect confining the light emitted by the light emitting layer 10 therebetween. The n-type AlGaN cladding layer 14 is made of an n-type semiconductor prepared by doping AlGaN with Si, for example, serving as an n-type dopant (in a doping concentration of $1\times10^{18}$ cm$^{-3}$, for example). The p-type AlGaN cladding layer 18 is made of a p-type semiconductor prepared by doping AlGaN with Mg serving as a p-type dopant (in a doping concentration of $1\times10^{19}$ cm$^{-3}$, for example).

The n-type GaN guide layer 15 and the p-type GaN guide layer 17 are semiconductor layers providing a carrier confining effect for confining carriers (electrons and positive holes) in the light emitting layer 10. Thus, the efficiency of recombination of the electrons and positive holes is improved in the light emitting layer 10. The n-type GaN guide layer 15 is made of an n-type semiconductor prepared by doping GaN with Si, for example, serving as an n-type dopant (in a doping concentration of $1\times10^{18}$ cm$^{-3}$, for example). The p-type GaN guide layer 17 is made of a p-type semiconductor prepared by doping GaN with Mg, for example, serving as a p-type dopant (in a doping concentration of $5\times10^{18}$ cm$^{-3}$, for example).

The p-type AlGaN electron blocking layer 16 is made of a p-type semiconductor prepared by doping AlGaN with Mg, for example, serving as a p-type dopant (in a doping concentration of $5\times10^{18}$ cm$^{-3}$, for example), for preventing the electrons from flowing out of the light emitting layer 10 and improving the efficiency of recombination of the electrons and the positive holes.

The light emitting layer 10, having an MQW (multiple-quantum well) structure containing InGaN, for example, is a layer for emitting light by recombination of the electrons and the positive holes and amplifying the emitted light. More specifically, the light emitting layer 10 is formed by alternately repetitively stacking InGaN sublayers (each having a thickness of 3 nm, for example) and GaN sublayers (each having a thickness of 9 nm, for example) by a plurality of cycles. In this case, the In composition ratio of each InGaN layer is set to not less than 5%, so that the InGaN layer has a relatively small band gap and constitutes a quantum well layer. On the other hand, each GaN layer functions as a barrier layer having a relatively large band gap. The InGaN layers and the GaN layers are alternately repetitively stacked by two to seven cycles, for example, to constitute the light emitting layer 10 having the MQW structure. The emission wavelength is set to 400 nm to 550 nm, for example, by controlling the In composition in the quantum well layers (InGaN layers).

The p-type semiconductor layered portion 12 is partially removed, to form a ridge stripe 20. More specifically, the p-type contact layer 19, the p-type AlGaN cladding layer 18 and the p-type GaN guide layer 17 are partially removed by etching, to form the ridge stripe 20 having a generally trapezoidal cross-section. This ridge stripe 20 is formed along the c-axis direction.

The group III nitride semiconductor multilayer structure 2 has a pair of end faces 21 and 22 formed by cleaving both longitudinal ends of the ridge stripe 20. The pair of end faces 21 and 22 are cleavage planes parallel to each other, and both of the end faces 21 and 22 are perpendicular to the c-axis. Thus, the n-type GaN guide layer 15, the light emitting layer 10 and the p-type GaN guide layer 17 constitute a Fabry-Perot resonator having the end faces 21 and 22 as the resonator end faces. In other words, the light emitted in the light emitting layer 10 reciprocates between the resonator end faces 21 and 22, and is amplified by induced emission. Part of the amplified light is extracted as a laser beam from the resonator end faces 21 and 22.

The n-side electrode 3 and the p-side electrode 4 are in ohmic contact with the group III nitride semiconductor substrate 1 and the p-type contact layer 19 respectively. The n-side electrode 3 is formed by stacking an Au layer on a Ti layer in contact with the substrate 1, for example. The p-side electrode 4 is formed by stacking an Au layer on a layer of Pd, Pt or Ni in contact with the p-type contact layer 19, for example. Alternatively, the p-side electrode 4 may be formed by a single Au layer.

An insulating layer 6 covering the exposed surfaces of the n-type GaN guide layer 17 and the p-type AlGaN cladding layer 18 is provided such that the p-side electrode 4 is in contact with only the p-type GaN contact layer 19 provided on the top face of the ridge stripe 20. Thus, a current can be concentrated on the ridge stripe 20, thereby enabling efficient laser oscillation. In the semiconductor laser diode 70, the portion located immediately under the ridge stripe 20 on which the current is concentrated forms a waveguide 25 (light guide) for transmitting the light. In other words, the waveguide 25 is also orthogonal to the resonator end faces 21 and 22 (c-planes), similarly to the ridge stripe 20.

Further, the waveguide 25 has a width of 1 μm to 2 μm, for example. FIGS. 1 and 3A show the waveguide 25 in an enlarged manner. In relation to the p-side electrode 4, a contact electrode (not shown) covering only the ridge stripe 20 and the circumference thereof may be provided under the p-side electrode 4.

According to this embodiment, the resonator end faces 21 and 22 are formed by c-planes (+c- and −c-planes), and the resonator end face 21 is a +c-axis side end face, for example, while the resonator end face 22 is a −c-axis side end face, for example. In this case, the crystal plane of the resonator end face 21 is defined by the +c-plane, and that of the resonator end face 22 is defined by the −c-plane. Insulating films 23 and 24 (see FIG. 2) different in reflectivity from each other are formed on the resonator end faces 21 and 22 respectively. More specifically, the insulating film 23 having smaller reflectivity is formed on the +c-axis side end face 21, and the insulating film 24 having larger reflectivity is formed on the −c-axis side end face 22. Therefore, the +c-axis side end face 21 emits a larger laser output. In other words, the +c-axis side end face 21 serves as a laser emitting end face in this semiconductor laser diode 70.

According to this structure, light having a wavelength of 400 nm to 550 nm can be emitted by connecting the n-side electrode 3 and the p-side electrode 4 to a power source and injecting the electrons and the positive holes into the light emitting layer 10 from the n-type semiconductor layered portion 11 and the p-type semiconductor layered portion 12 respectively, thereby recombining the electrons and the positive holes in the light emitting layer 10. This light reciprocates between the resonator end faces 21 and 22 along the guide layers 15 and 17, and is amplified by induced emission. Thus, a higher laser output is extracted from the resonator end face 21 serving as the laser emitting end face.

As shown in FIGS. 3A and 3B, a pair of ridge protecting electrodes 27 (not shown in FIG. 1) are formed on the p-side electrode 4, on both sides of the ridge stripe 20. The ridge protecting electrodes 27 are formed by stacking Ti layers and Au layers, for example, parallel to the ridge stripe 20, and have top faces 27a higher than the upper surface of the ridge stripe 20. A bonding wire 28 is connected to the top faces 27a of the ridge protecting electrodes 27. The ridge protecting electrodes 27 connected with the bonding wire 28 catch an impact from a bonding head. Thus, the ridge stripe 20 can be protected against the impact.

The ridge protecting electrodes 27 can be formed by lift-off, for example. According to this method, a resist film having opening patterns corresponding to the ridge protecting electrodes 27 is formed on the overall surface of the substrate after the formation of the p-side electrode 4. In this state, a material film consisting of the material for the ridge protecting electrodes 27 is formed on and in the resist film. Thereafter the material film is lifted off along with the resist film. Thus, the ridge protecting electrodes 27 are formed on both sides of the ridge stripe 20.

A method of manufacturing the semiconductor laser diode 70 is now described.

Figure 4:
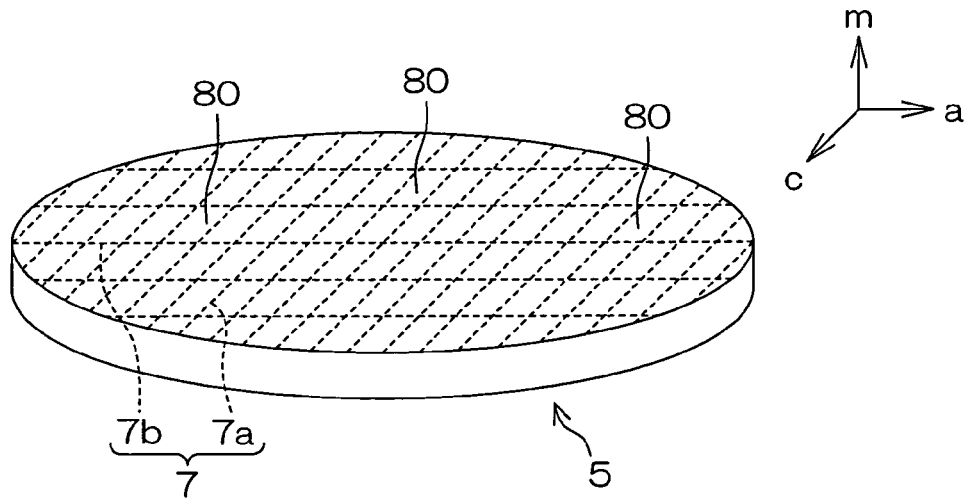
FIG. 4 is a perspective view schematically showing a wafer provided with individual devices.

In order to manufacture the semiconductor laser diode 70, individual devices 80 (group III nitride semiconductor substrates) each constituting the semiconductor laser diode 70 are formed on a wafer 5 constituting the aforementioned group III nitride semiconductor substrate 1 consisting of the GaN monocrystalline substrate, as schematically shown in FIG. 4.

More specifically, the n-type semiconductor layered portion 11, the light emitting layer 10 and the p-type semiconductor layered portion 12 are epitaxially grown on the wafer 5 (in the state of the GaN monocrystalline substrate), thereby forming the group III nitride semiconductor multilayer structure 2. After the formation of the group III nitride semiconductor multilayer structure 2, the ridge stripe 20 is formed by dry etching, for example. Then, the insulating layer 6, the p-side electrode 4 and the n-side electrode 3, and the ridge protecting electrodes 27 are formed. Thus, the wafer 5 is obtained in the state formed with each individual device 80. In advance of the formation of the n-side electrode 3, grinding/polishing (chemical mechanical polishing, for example) is performed from the back surface of the wafer 5 in order to reduce the thickness thereof, if necessary.

The respective individual devices 80 are formed on rectangular regions partitioned by tessellated cutting lines (virtual lines) virtually formed on the wafer 5. Therefore, the cutting lines 7 include cutting lines 7a along the c-axes (along the a-planes) and cutting lines 7b along the a-axes (along the c-planes).

The wafer 5 is divided into the respective individual devices 80 along the cutting lines 7. In other words, the wafer 5 is cleaved along the cutting lines 7, to cut out the individual devices 80.

The method of dividing the wafer 5 into the individual devices 80 is now specifically described.

Figure 5A:
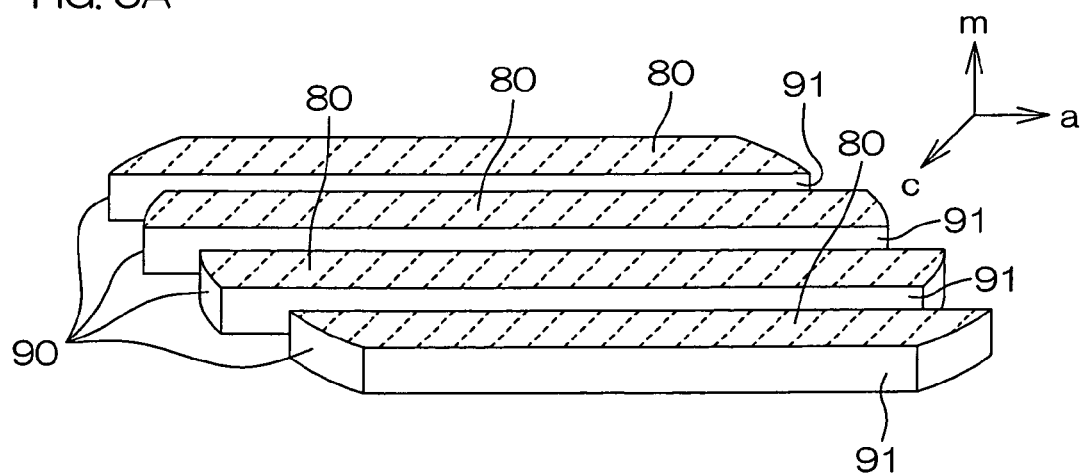
FIGS. 5A and 5B are schematic perspective views for illustrating an outline of a procedure for dividing the wafer into the individual devices.
Figure 5B:
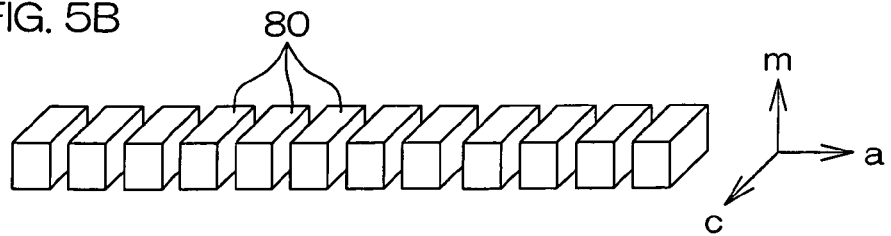

FIGS. 5A and 5B are schematic perspective views for illustrating an outline of the procedure for dividing the wafer into the individual devices 80. First, the wafer 5 is cleaved along the cutting lines 7b orthogonal to the resonator direction (c-axis direction) (i.e., parallel to the c-planes). Thus, a plurality of bar bodies 90 are obtained as shown in FIG. 5A. Both side surfaces 91 of each bar body 90 are defined by crystal planes for forming the resonator end faces 21 and 22. The aforementioned insulating films 23 and 24 (edge coat films for adjusting the reflectivity values: see FIG. 2) are formed on the side surfaces 91 of each bar body 90.

Then, each bar body 90 is cut along the cutting lines 7a parallel to the resonator direction (c-axis direction). Thus, the bar body 90 is divided into the individual devices 80 and a plurality of chips are obtained, as shown in FIG. 5B.

Figure 6A:
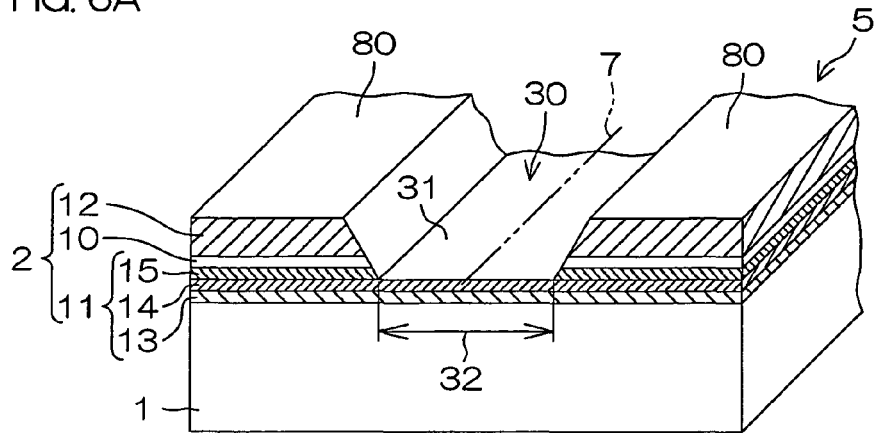
FIGS. 6A, 6B and 6C are schematic perspective views for illustrating the method of dividing the wafer into the individual devices.
Figure 6B:
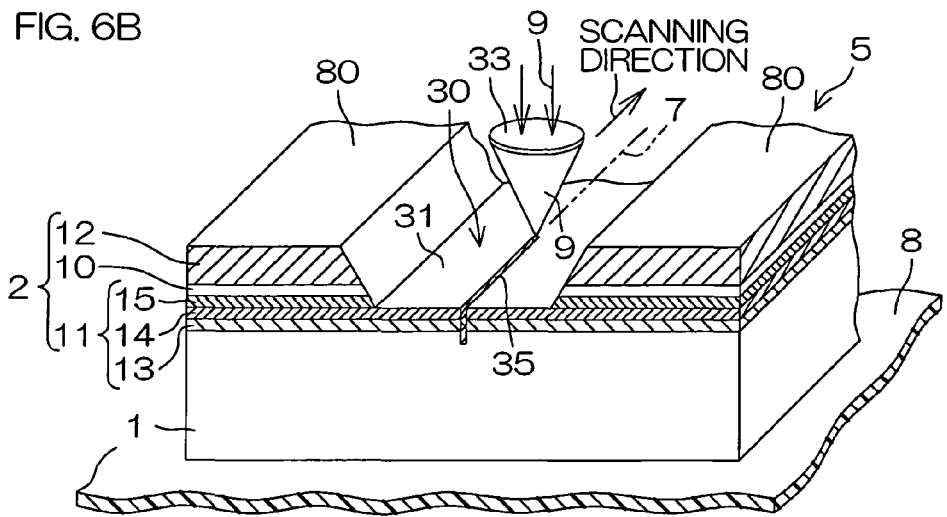
Figure 6C:
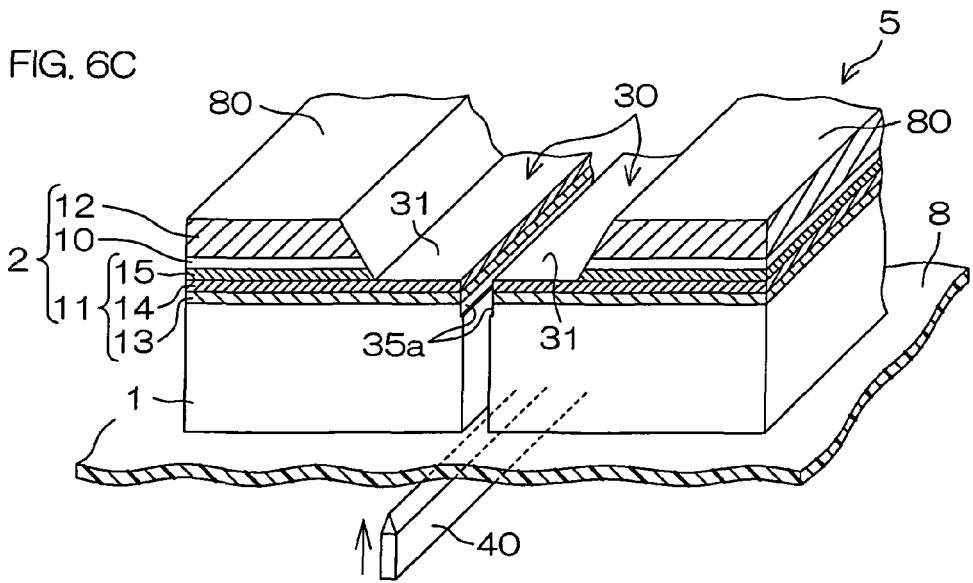

FIGS. 6A, 6B and 6C are schematic perspective views for illustrating the method of dividing the wafer 5 into the individual devices 80. Referring to FIGS. 6A, 6B and 6C, illustration of the n-side electrode 3, the p-side electrode 4, the insulating layer 6 and the ridge protecting electrodes 27 is omitted.

First, the group III nitride semiconductor multilayer structure 2 is selectively etched on a region of a prescribed width along each cutting line 7 as shown in FIG. 6A. The group III nitride semiconductor multilayer structure 2 is etched up to a depth for exposing the n-type AlGaN cladding layer 14 through the p-type semiconductor layered portion 12 and the light emitting layer 10, and further through the n-type GaN guide layer 15 of the n-type semiconductor layered portion 11. In other words, an etching groove 30 having the depth for exposing the n-type AlGaN cladding layer 14 is formed along the cutting line 7. A bottom surface portion 31 (exposed portion of the n-type AlGaN cladding layer 14) of the etching groove 30 has a width 32 of about 20 μm.

Figure 7:
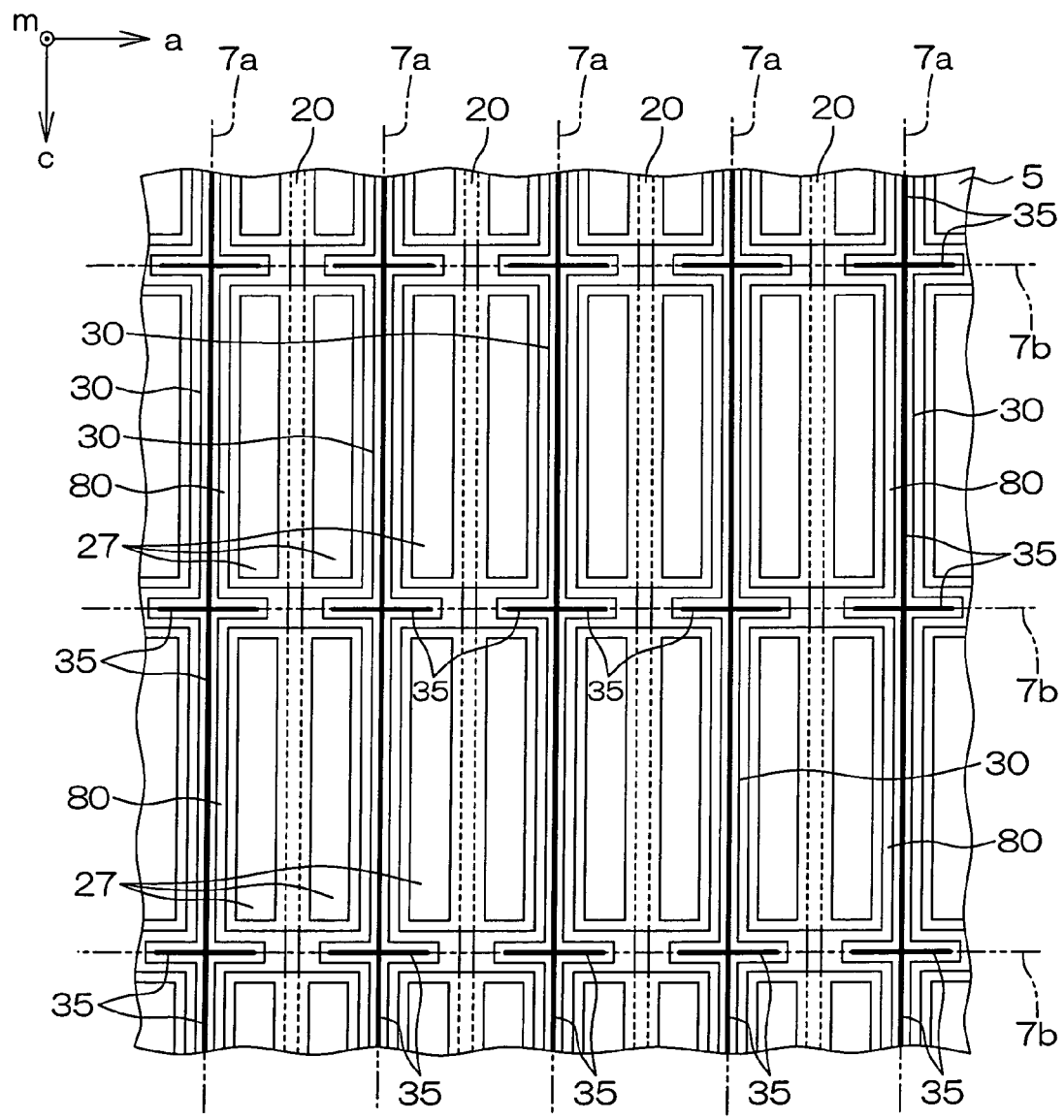
FIG. 7 is a schematic plan view for illustrating regions for forming etching grooves.

Such etching grooves 30 are formed along both of the cutting lines 7a parallel to the c-axes and the cutting lines 7b perpendicular to the c-axes as shown in FIG. 7. However, the etching grooves 30 along the cutting lines 7b perpendicular to the c-axes are formed in perforation patterns each partitioned on the region of the ridge stripe 20 provided with the waveguide 25. Thus, no etching groove 30 is formed on the region of the waveguide 25. The p-side electrode 4 is selectively formed inside the region provided with the corresponding etching groove 30. On this p-side electrode 4, the ridge protecting electrodes 27 are formed on both sides of the ridge stripe 20.

Then, a division guide groove 35 along the cutting line 7 is formed in the n-type AlGaN cladding layer 14 on the bottom surface portion 31 of the etching groove 30 as shown in FIG. 6B. The division guide groove 35, which may be formed up to an intermediate portion of the n-type AlGaN layer 14 in the thickness direction, preferably has a depth at least reaching the n-type GaN contact layer 13 through the n-type AlGaN layer 14, and more preferably has a depth reaching the group III nitride semiconductor substrate 1 through the n-type GaN contact layer 13.

As shown by thick lines in FIG. 7, such division guide grooves 35 are formed along both of the cutting lines 7a parallel to the c-axes and the cutting lines 7b perpendicular to the c-axes on the bottom portions of the etching grooves 30. The division guide grooves 35 along the cutting lines 7b perpendicular to the c-axes are formed in perforation patterns each partitioned on the region of the ridge stripe 20, similarly to the etching grooves 30. More specifically, the division guide grooves 35 along the cutting lines 7b are formed as line segment patterns shorter than the etching grooves 30, to provide allowances on both end portions of the etching grooves 30.

According to this embodiment, each division guide groove 35 is formed by a laser processor. More specifically, the wafer 5 including the plurality of individual devices 80 is bonded to a support sheet 8. This support sheet 8 is an adhesive sheet for preventing scattering of the individual devices 80 cut out from the wafer 5.

The wafer 5 supported by the support sheet 8 may be directed upward for opposing the surface (closer to the n-side electrodes 3) opposite to the group III nitride semiconductor multilayer structure 2 to the support sheet 8.

Then, the laser processor is so employed as to form each division guide groove 35 on the bottom surface portion 31 of the etching groove 30 along the corresponding cutting line 7. While the detailed structure thereof is not shown, the laser processor includes a laser beam generating unit, a laser application head including a conversing lens 33 conversing a laser beam generated by the laser beam generating unit, and an X-Y stage mechanism. FIGS. 6A to 6C show only the conversing lens 33 among these elements. A YAG laser or an excimer laser, for example, can be employed as the laser beam generating unit. The X-Y stage mechanism includes a stage holding the wafer 5 through the support sheet 8 and a moving mechanism two-dimensionally moving this stage in two orthogonal directions X and Y (horizontal directions, for example) orthogonal to each other. The X-Y stage mechanism may further include a mechanism for moving the stage along a direction Z (vertical direction, for example) approximating/separating the stage to/from the conversing lens 33, if necessary. The conversing lens 33 is capable of conversing the laser beam 9, and the focal length thereof may be rendered adjustable, if necessary. The distance between the conversing lens 33 and the wafer 5 may be adjusted by approximating/separating the conversing lens 33 to/from the stage of the X-Y stage mechanism, or by approximating/separating the stage of the X-Y stage mechanism to/from the conversing lens 33. Thus, the positional relation between the focal point of the conversing lens 33 and the wafer 5 can be adjusted. This positional relation can be adjusted by adjusting the focal length of the conversing lens 33, as a matter of course.

The laser processor having the aforementioned structure scans the wafer 5 with the laser beam 9. More specifically, the laser processor scans the wafer 5 with the laser beam 9 along the cutting line 7, to form the division guide groove 35 on the bottom surface portion 31 of the etching groove 30.

In the scanning process, the laser beam 9 may be regularly applied to the wafer 5, or the laser beam generating unit may be so on-off controlled as to intermittently apply the laser beam 9.

On each position irradiated with the laser beam 9, the laser beam 9 is converged on the bottom surface portion 31 of the division guide groove 35 to cause multiphoton absorption on the focal point. The focal point is scanned along the bottom surface portion 31 of the division guide groove 35, whereby the division guide groove 35 is formed on the boundary between the individual devices 80 along the cutting line 7. The division guide groove 35 is continuously formed if the laser beam 9 is regularly applied in the scanning process, while division guide grooves 35 divided in a perforated manner at a prescribed interval in the scanning direction are formed if the laser beam 9 is intermittently applied in the scanning process. However, FIGS. 6B and 6C show the continuous division guide groove 35.

The wavelength of the laser beam 9 for scanning the wafer 5 is 500 nm to 700 nm, for example. The laser beam 9 having the wavelength in this range is not absorbed by the group III nitride semiconductors on regions other than the focal point. At the focal point having high energy density, multiphoton absorption is caused. In other words, a next photon is incident before the group III nitride semiconductor materials excited to a virtual level between a base level and an excited level by incidence of a photon returns to the base level through a certain time constant. Therefore, the group III nitride semiconductor materials are excited to the excited level (two-photon absorption). Thus, the division guide groove 35 is formed on the bottom surface portion 31 of the etching groove 30 due to the multiphoton absorption.

The energy density of the laser beam 9 is preferably in the range of $1 \times 10^8$ W/cm$^2$ to $1 \times 10^{12}$ W/cm$^2$ ($3.0 \times 10^{10}$ W/cm$^2$, for example) at the focal point, for example. If the energy density of the laser beam 9 at the focal point is in this range, the bottom surface portion 31 of the etching groove 30 can be excellently processed for excellently forming the division guide groove 35. The energy density of the laser beam 9 can be controlled by adjusting the output of the laser beam generating unit.

The moving speed for the wafer 5 (i.e., the moving speed for the stage) scanned with the laser beam 9 along the cutting line 7 is set to 3 mm/sec., for example.

The depth of the division guide groove 35 is about 10 μm, for example. In this case, the division guide groove 35 reaches the group III nitride semiconductor substrate 1 through the n-type AlGaN cladding layer 14 and the n-type GaN contact layer 13.

After the formation of the division guide groove 35, external force is applied to the wafer 5, thereby dividing the wafer 5 (dividing step), as shown in FIG. 6C. More specifically, a blade 40 is applied from the side of the support sheet 8 along the division guide groove 35, and external stress (external force perpendicular to the major surface of the wafer 5) is applied to the wafer 5. Thus, a crack is formed from the division guide groove 35, thereby dividing the wafer 5. At this time, stress in a shrinkage direction along the major surface of the wafer 5 is effectively utilized in the n-type AlGaN cladding layer 14, such that the wafer 5 is spontaneously divided along the division guide groove 35. Thus, the divided wafer 5 has excellent cut end faces, and is stabilized in shape.

As hereinabove described, the wafer 5 is first divided into the plurality of bar bodies 90 (see FIG. 5A) through the division at the cutting lines 7b along the a-axes. After the formation of the aforementioned insulating films 23 and 24 serving as reflecting films, the plurality of bar bodies 90 are divided along the cutting liens 7a along the c-axes (see FIG. 5B). Thus, the plurality of individual devices 80 each having the same size as the semiconductor laser diode 70 separated from the wafer 5 are obtained.

The semiconductor laser diode 70 obtained in this manner has the etching grooves 30 on peripheral edge portions of the upper surface avoiding the ridge stripe 20 (laser resonator), as shown in FIG. 1. More specifically, the etching grooves 30 extend along the overall regions of both side edges parallel to the ridge stripe 20, and are formed on regions avoiding the ridge stripe 20 on both edges perpendicular to the ridge stripe 20. Step portions 35a corresponding to the division guide grooves 35 are formed on edge portions of the bottom surfaces of the etching grooves 30. The step portions 35a extend along the overall regions on both side surface portions parallel to the ridge stripe 20, and are formed on regions outside the bottom surface portions of the etching grooves 30 on both end face portions perpendicular to the ridge stripe 20. Side surfaces of the device on portions other than the step portions 35a are cleavage planes.

According to this embodiment, as hereinabove described, the etching grooves 30 exposing the n-type AlGaN cladding layer 14 are formed along the cutting lines 7 after the formation of the group III nitride semiconductor multilayer structure 2 constituting a laser structure is formed on the group III nitride semiconductor substrate 1. Thus, the group III nitride semiconductor layer located above the n-type AlGaN cladding layer 14 is completely partitioned in relation to the a-axis direction, and partitioned while leaving the portion of the waveguide 25 in relation to the c-axis direction. In this state, the division guide grooves 35 are formed on the bottom surface portions 31 of the etching grooves 30 along the cutting lines 7, and the wafer 5 is broken through the division guide grooves 35.

The n-type AlGaN cladding layer 14, having a smaller lattice constant than the group III nitride semiconductor substrate 1 made of GaN, causes the stress in the shrinkage direction along the major surface of the wafer 5. When supported by the support sheet 8 and held in a generally planar shape (hardly warped shape), therefore, the wafer 5 is easily cracked through the division guide grooves 35. Consequently, the wafer 5 is spontaneously divided, whereby excellent cut end faces are obtained not only along the cutting lines 7 along the c-planes but also along the cutting lines 7 along the a-planes. Thus, the shape of each chip can be stabilized, and, therefore, the nitride semiconductor laser diode 70 employing the group III nitride semiconductor can be prepared with an excellent yield.

Figure 8:
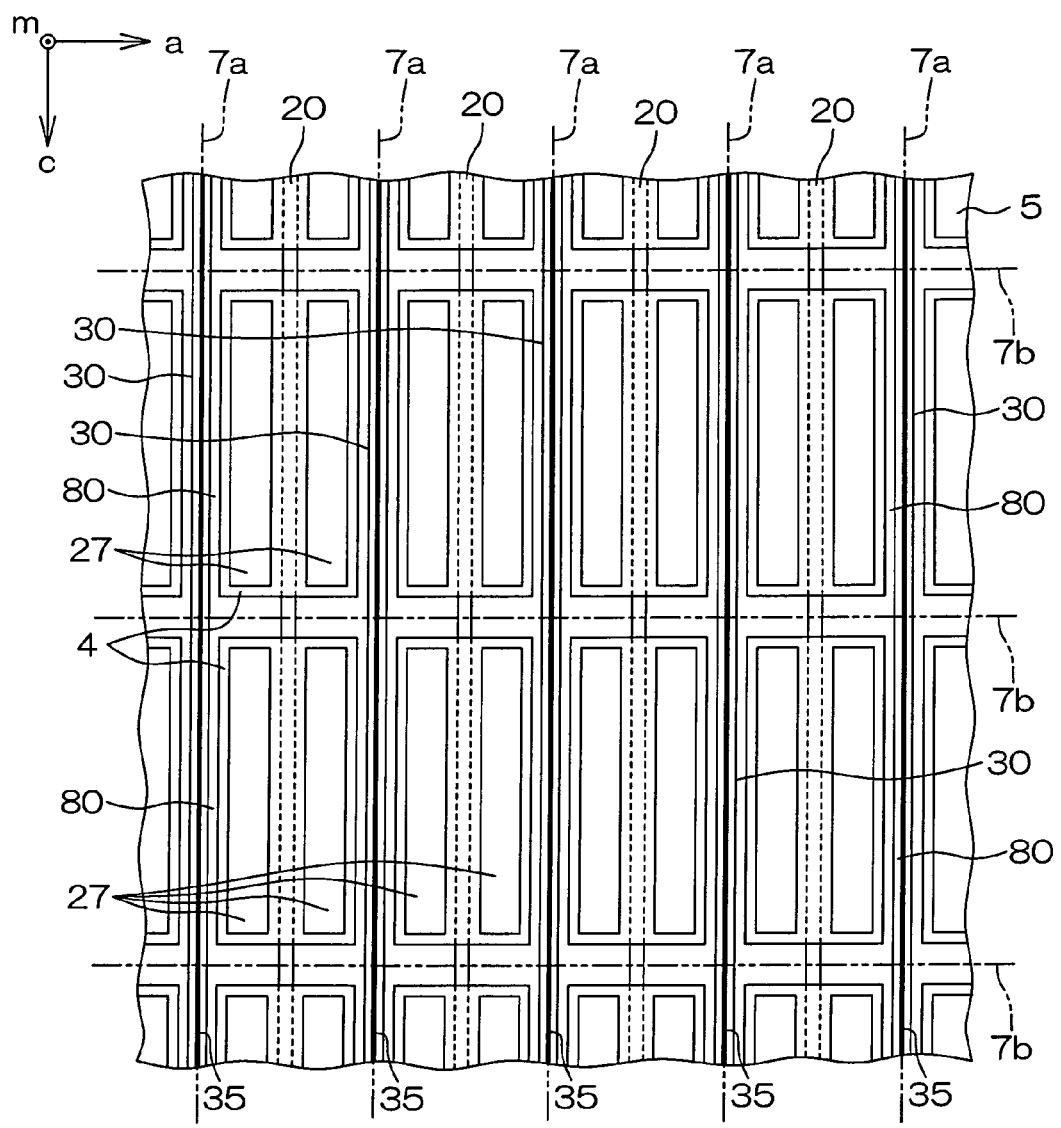
FIG. 8 is a schematic plan view for illustrating a method of manufacturing a semiconductor light emitting device according to a second embodiment of the present invention, showing regions for forming etching grooves.

FIG. 8 is a schematic plan view for illustrating a method of manufacturing a semiconductor light emitting device according to a second embodiment of the present invention. Referring to FIG. 8, portions corresponding to those shown in FIG. 7 are denoted by the same reference numerals.

According to this embodiment, etching grooves 30 exposing an n-type AlGaN cladding layer 14 are formed along cutting lines 7*a* parallel to a-planes (i.e., parallel to a resonator direction), while no etching grooves are formed along cutting lines 7*b* parallel to c-planes (i.e., orthogonal to the resonator direction).

Cleavage along the cutting lines 7*b* along the c-planes can be stably performed also by a conventional method. According to this embodiment, a step of forming the etching grooves 30 exposing the n-type AlGaN cladding layer 14 is applied with respect to wafer division along the cutting lines 7*a* along the a-planes. The wafer division along the cutting lines 7*b* along the c-planes may be performed by forming division guide grooves along the cutting lines 7*b* on a surface of a wafer 5 opposite to a group III nitride semiconductor multilayer structure 2 and breaking the wafer 5 along the division guide grooves, for example. Laser processing, scribing with a diamond cutter, grooving with a dicer or the like can be applied to this formation of the division guide grooves.

In the structure of this embodiment, a finally obtained semiconductor laser diode 70 has the etching grooves 30 along the overall regions of both side edges parallel to a ridge stripe 20. No etching grooves are formed on both edges perpendicular to the ridge stripe 20. Step portions corresponding to the division guide grooves 35 are formed on edge portions of the bottom surfaces of the etching grooves 30. The step portions extend along the overall regions on both side surface portions parallel to the ridge stripe 20.

While two embodiments of the present invention have been described, the present invention can also be carried out in other modes. For example, while the laser processing is applied for forming the division guide grooves 35 on the bottom surface portions 31 of the etching grooves 30 in the aforementioned embodiment, similar division guide grooves 35 may alternatively be formed by mechanical working with a diamond cutter or a dicer, for example.

While the n-type AlGaN cladding layer 14 is formed by a single layer of AlGaN in the aforementioned embodiment, the n-type AlGaN cladding layer 14 may alternatively have a superlattice structure obtained by alternately stacking AlGaN layers and GaN layers.

While the group III nitride semiconductor multilayer structure 2 is formed on the group III nitride semiconductor substrate 1 consisting of the GaN monocrystalline substrate in the aforementioned embodiment, the present invention can also be applied to another group III nitride semiconductor substrate, other than the GaN substrate, having a larger lattice constant than AlGaN, for excellently dividing the substrate.

The major surface of the group III nitride semiconductor substrate may not necessarily be defined by the m-plane, but may be defined by another nonpolar plane such as the a-plane, a semipolar plane or the c-plane which is a polar plane. When the major surface of the substrate is defined by the c-plane, the c-axes and the m-axes may be exchanged in FIGS. 4, 5A and 5B, for example.

While the present invention is applied to manufacturing of the semiconductor laser diode in each of the aforementioned embodiments, the present invention is also applicable to manufacturing of another type of light emitting device such as a light emitting diode (LED).

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-228032 filed in the Japanese Patent Office on Sep. 3, 2007, the disclosure of which is incorporated herein by reference in its entirety.

What is claimed is:

1. A method of manufacturing a semiconductor light emitting device having a ridge, comprising the steps of:
    selectively etching a substrate formed by successively stacking an n-type semiconductor layered portion including an AlGaN layer, a light emitting layer containing In and a p-type semiconductor layered portion on a group III nitride semiconductor substrate having a larger lattice constant than AlGaN, the selective etching performed from the side of the p-type semiconductor layered portion along a cutting line to form etching grooves exposing the AlGaN layer along the cutting line so that the etching grooves are formed apart from the ridge;
    forming a pair of ridge protecting electrodes on both sides of the ridge, wherein the pair of ridge protecting electrodes includes top faces higher than an upper surface of the ridge and the pair of ridge protecting electrodes does not overlap the upper surface of the ridge;
    forming a plurality of division guide grooves along the cutting line on the exposed AlGaN layer on bottom surface portions of the etching grooves; and
    dividing the substrate along the division guide groove, wherein
    the etching grooves include etching grooves extending along entire regions of both side edges parallel to the ridge, and an etching groove extending perpendicular to the ridge while avoiding the ridge.

2. The method of manufacturing a semiconductor light emitting device according to claim 1, wherein
    the substrate includes no layer containing In between the group III nitride semiconductor substrate and the AlGaN layer.

3. The method of manufacturing a semiconductor light emitting device according to claim 1, wherein
    the AlGaN layer has a superlattice structure obtained by alternately stacking a layer made of AlGaN and a layer made of GaN.

4. The method according to claim 1, wherein the step of forming the plurality of divisional guide grooves includes a laser processing step of forming, by laser processing, division guide grooves extending along entire regions of both side edges parallel to the ridge, and a division guide groove extending perpendicular to the ridge while avoiding the ridge.

5. The method of manufacturing a semiconductor light emitting device according to claim 4, wherein
    the laser processing step includes a step of forming the plurality of division guide grooves with a laser beam having a wavelength of 500 nm to 700 nm.

6. The method of manufacturing a semiconductor light emitting device according to claim 4, wherein the laser processing is intermittently applied.

7. The method of manufacturing a semiconductor light emitting device according to claim 4, wherein the laser processing is applied in a perforated manner at a prescribed interval in a scanning direction of a laser beam.

8. The method according to claim 1, wherein the step of forming the pair of ridge protecting electrodes includes stacking Ti and Au layers parallel to the ridge.

9. The method according to claim 1, further comprising forming a waveguide immediately under the ridge.

10. The method according to claim 1, further comprising connecting a bonding wire to the top faces of the ridge protecting electrodes.

11. The method according to claim 1, further comprising separating the ridge protecting electrodes from the ridge with spaces between the ridge and the respective ridge protecting electrodes.

12. A semiconductor light emitting device having a ridge, comprising:
   a group III nitride semiconductor substrate having a larger lattice constant than AlGaN; and
   an n-type semiconductor layered portion including an AlGaN layer, a light emitting layer containing In and a p-type semiconductor layered portion successively stacked on the semiconductor substrate, wherein
   etching grooves are formed on a peripheral edge portion avoiding the ridge of a surface of the device by removing the p-type semiconductor layered portion and the light emitting layer by etching, for exposing the surface of the AlGaN layer,
   a pair of ridge protecting electrodes is formed on both sides of the ridge, wherein the pair of ridge protecting electrodes includes top faces higher than an upper surface of the ridge and the pair of ridge protecting electrodes does not overlap the upper surface of the ridge,
   the etching grooves are formed apart from the ridge, and include etching grooves extending along entire regions on both side edges parallel to the ridge, and an etching groove extending perpendicular to the ridge while avoiding the ridge, and
   step portions are formed on an edge portion of the AlGaN layer exposed on bottom portions of the etching grooves.

13. The semiconductor light emitting device according to claim 12, wherein
   the substrate includes no layer containing In between the group III nitride semiconductor substrate and the AlGaN layer.

14. The semiconductor light emitting device according to claim 12, wherein
   the semiconductor light emitting device is a semiconductor laser device having a laser resonator along the ridge, and
   the etching grooves are formed on regions avoiding the laser resonator.

15. The semiconductor light emitting device according to claim 12, wherein step portions are formed on edge portions of bottom portions of the etching grooves.

16. The semiconductor light emitting device according to claim 12, wherein the group III nitride semiconductor substrate has a major surface defined by a nonpolar plane.

17. The semiconductor light emitting device according to claim 12, wherein the step portions include step portions extending along entire region of both side edges parallel to the ridge, and a step portion extending perpendicular to the ridge while avoiding the ridge.

18. The semiconductor light emitting device according to claim 12, wherein the ridge protecting electrodes are comprised of layers of Ti and Au stacked in parallel to the ridge.

19. The semiconductor light emitting device according to claim 12, wherein the ridge protecting electrodes are formed on the p-type semiconductor layered portion.

20. The semiconductor light emitting device according to claim 12, wherein the ridge protecting electrodes are separated from the ridge with spaces between the ridge and the respective ridge protecting electrodes.

* * * * *